(12) United States Patent
Son (10) Patent No.: US 12,249,895 B2
(45) Date of Patent: Mar. 11, 2025

(54) VEHICULAR DISPLAY APPARATUS AND OPERATING METHOD THEREOF

(71) Applicant: HYUNDAI MOBIS CO., LTD., Seoul (KR)

(72) Inventor: Ho Won Son, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 342 days.

(21) Appl. No.: 17/985,303

(22) Filed: Nov. 11, 2022

(65) Prior Publication Data

US 2023/0387748 A1 Nov. 30, 2023

(30) Foreign Application Priority Data

May 25, 2022 (KR) .......................... 10-2022-0064006

(51) Int. Cl.
| | |
|---|---|
| *H02K 7/11* | (2006.01) |
| *H02K 7/00* | (2006.01) |
| *H02K 7/116* | (2006.01) |
| *H02K 11/20* | (2016.01) |
| *H05K 5/00* | (2006.01) |
| *B60K 35/00* | (2006.01) |
| *B60K 35/22* | (2024.01) |
| *B60K 35/53* | (2024.01) |

(52) U.S. Cl.
CPC ............. *H02K 7/116* (2013.01); *H02K 7/003* (2013.01); *H02K 11/20* (2016.01); *H05K 5/0018* (2022.08); *B60K 35/00* (2013.01); *B60K 35/22* (2024.01); *B60K 35/53* (2024.01)

(58) Field of Classification Search
CPC .... G01B 11/26; B62D 15/02; B62D 15/0215; H02K 7/003; H02K 7/116; H02K 11/20
See application file for complete search history.

(56) References Cited

U.S. PATENT DOCUMENTS

| | | | | |
|---|---|---|---|---|
| 8,390,276 | B2* | 3/2013 | McDonald | G01D 5/145 |
| | | | | 324/207.25 |
| 2011/0309827 | A1* | 12/2011 | Ruebenhagen | G01D 5/04 |
| | | | | 324/207.25 |

FOREIGN PATENT DOCUMENTS

KR 2004-0097635 A 11/2004

\* cited by examiner

*Primary Examiner* — Leda T Pham
(74) *Attorney, Agent, or Firm* — NovoTechIP International PLLC (57) ABSTRACT

A vehicular display apparatus is provided. The vehicular display apparatus includes a driving device installed in a housing, a display module configured to move to an inner portion or an outer portion of the housing, based on a mechanical operation of the driving device, and a controller unit configured to control the mechanical operation of the driving device. The driving device includes a gear configured to move the display module to the inner portion or the outer portion of the housing and a light emitting sensor and a light receiving sensor facing each other with the gear therebetween. The light receiving sensor senses an optical signal of the light emitting sensor passing through a region between gear teeth of the gear, and the controller unit counts the number of gear teeth of the gear passing through a region between the light emitting sensor and the light receiving sensor on a basis of a sensing result of the light receiving sensor and controls movement of the display module, based on the counted number of gear teeth.

16 Claims, 8 Drawing Sheets

VEHICULAR DISPLAY APPARATUS AND OPERATING METHOD THEREOF

CROSS-REFERENCE TO RELATED APPLICATIONS

This application claims the benefit of the Korean Patent Application No. 10-2022-0064006 filed on May 25, 2022, which is hereby incorporated by reference as if fully set forth herein.

TECHNICAL FIELD

The present invention relates to a vehicular display apparatus, and more particularly, to a vehicular display apparatus where a monitor may be loaded into a module or unloaded to the outside of the module.

BACKGROUND

As the supply of electric vehicles and autonomous driving vehicles increase, the demands of consumers for enhancing the quantitative and qualitative functions of an in-vehicle display system are increasing.

As the demands of consumers increase, a size of a display module applied to vehicular display apparatuses is progressively enlarged. Based on the enlargement of display modules, much information may be provided to drivers, but the indoor design beauty of vehicles is reduced.

Moreover, because display modules provide much information, a time for which a driver looks at a display module increases, and due to this, driver vigilance against a front region is pretermitted, causing a traffic accident.

In order to solve such a problem, technology where a display module is embedded in an instrument panel or a cockpit module not to interrupt driving while maintaining the continuity of indoor design of a vehicle has been applied to some kinds of vehicles.

However, because a user may not check information needed for driving of a vehicle in a state where a display module is completely embedded in an instrument panel, the inconvenience of the user and a risk of occurrence of an accident may more increase.

Therefore, it is required to develop technology which may quantitatively the movement amount (or position) of a display module so as to expose the display module at the outside of an instrument panel so that a user sees differentiated user interface (UI) information on the basis of the requirement of the user, rather than that the display module is completely embedded in the instrument panel, but the development of the technology is yet insufficient.

SUMMARY

An aspect of the present invention is directed to providing a vehicular display apparatus and an operating method thereof, which may precisely control the movement amount (or position) of a display module so as to expose the display module at the outside of a housing.

To achieve these and other advantages and in accordance with the purpose of the invention, as embodied and broadly described herein, there is provided a vehicular display apparatus including: a driving device installed in a housing; a display module configured to move to an inner portion or an outer portion of the housing, based on a mechanical operation of the driving device; and a controller unit configured to control the mechanical operation of the driving device, wherein the driving device includes: a gear configured to move the display module to the inner portion or the outer portion of the housing; and a light emitting sensor and a light receiving sensor facing each other with the gear therebetween, the light receiving sensor senses an optical signal of the light emitting sensor passing through a region between gear tooth of the gear, and the controller unit counts the number of gear tooth of the gear passing through a region between the light emitting sensor and the light receiving sensor on a basis of a sensing result of the light receiving sensor and controls movement of the display module, based on the counted number of gear tooth.

In an embodiment, the gear includes: a first gear configured to perform a rotary motion; and a second gear gear-coupled to the first gear to change the rotary motion to a rectilinear reciprocating motion, and the light receiving sensor senses the optical signal of the light emitting sensor passing through a region between gear tooth of the first gear.

In an embodiment, the display module is connected to one end portion of the second gear and moves to the inner portion or the outer portion of the housing, based on the rectilinear reciprocating motion obtained through the change by the second gear.

In an embodiment, with reference to a lookup table, when the counted number of gear tooth of the gear matches the number of gear tooth of the gear stored in the lookup table, the controller unit transfers, to the driving device, a stop command for stopping movement of the display module.

In an embodiment, the display module displays a plurality of display regions displaying different pieces of user interface (UI) information, and the lookup table stores the number of gear tooth of the gear mapped to a movement amount of the display module exposing at least one display region, selected from among the plurality of display regions, to the outer portion of the housing.

In an embodiment, the driving device includes: an electric motor configured to generate rotary power; a main pulley coupled to a rotary shaft of the electric motor to rotate based on the rotary power; and a sub-pulley configured to receive rotary power of the main pulley through a timing belt, and the gear includes: a pinion gear coupled to a rotary shaft of the sub-pulley to rotate; and a rack gear gear-coupled to the pinion gear to change a rotary motion of the pinion gear to a rectilinear reciprocating motion.

In an embodiment, the light receiving sensor senses the optical signal of the light emitting sensor passing through a region between gear tooth of the pinion gear.

In an embodiment, the display module is coupled to one end portion of the rack gear and moves to the inner portion or the outer portion of the housing, based on the rectilinear reciprocating motion of the rack gear.

In another aspect of the present invention, there is provided a vehicular display apparatus including: a driving device installed in a housing; a display module configured to move to an inner portion or an outer portion of the housing, based on a mechanical operation of the driving device; and a controller unit configured to control the mechanical operation of the driving device, wherein the driving device includes: a gear configured to move the display module to the inner portion or the outer portion of the housing, a light emitting sensor configured to transfer an optical signal to a reflector provided on a teeth side surface of the gear, and a light receiving sensor configured to sense the optical signal reflected from the reflector, and the controller unit counts the number of gear tooth of the gear passing through a region between the light emitting sensor and the light receiving sensor on a basis of a sensing result of the light receiving sensor and controls movement of the display module, based on the counted number of gear tooth.

In an embodiment, the gear includes: a first gear configured to perform a rotary motion; and a second gear gear-coupled to the first gear to change the rotary motion to a rectilinear reciprocating motion, and the light receiving sensor senses the optical signal reflected from the reflector provided on a teeth side surface of the first gear.

In an embodiment, with reference to a lookup table, when the counted number of gear tooth of the gear matches the number of gear tooth of the gear stored in the lookup table, the controller unit transfers, to the driving device, a stop command for stopping movement of the display module.

In an embodiment, the driving device includes: an electric motor configured to generate rotary power; a main pulley coupled to a rotary shaft of the electric motor to rotate based on the rotary power; and a sub-pulley configured to receive rotary power of the main pulley through a timing belt, and the gear includes: a pinion gear coupled to a rotary shaft of the sub pulley to rotate; and a rack gear gear-coupled to the pinion gear to change a rotary motion of the pinion gear to a rectilinear reciprocating motion.

In an embodiment, the light receiving sensor senses the optical signal reflected from the reflector provided on a teeth side surface of the pinion gear.

In another aspect of the present invention, there is provided a vehicular display apparatus including: a driving device installed in a housing; a display module configured to move to an inner portion or an outer portion of the housing, based on a mechanical operation of the driving device; and a plurality of light emitting sensors arranged on a rear surface of the display module to move in a movement direction of the display module; a plurality of light receiving sensors arranged on a front surface of the housing to face the plurality of light emitting sensors; and a controller unit configured to receive a sensing result from at least one light receiving sensor, which has sensed an optical signal transferred from each of the plurality of light emitting sensors moving based on movement of the display module among the plurality of light receiving sensors, and control the driving device to stop the movement of the display module, based on the sensing result.

In an embodiment, the display module displays different pieces of user interface (UI) information on a plurality of display regions, and when the plurality of light receiving sensors sense all of optical signals from the plurality of light emitting sensors, the controller unit determines that one of the plurality of display regions is accurately exposed at the outer portion of the housing, and transfers, to the driving device, a stop command for stopping movement of the display module.

In an embodiment, the display module displays different pieces of user interface (UI) information on a plurality of display regions, and when one of the plurality of light receiving sensors senses an optical signal from the plurality of light emitting sensors, the controller unit determines that all of the plurality of display regions are accurately exposed at the outer portion of the housing, and transfers, to the driving device, a stop command for stopping movement of the display module.

In another aspect of the present invention, there is provided an operating method of a vehicular display apparatus including: a driving device including an electric motor and a gear configured to operate based on power of the electric motor; a display module configured to move to an inner portion or an outer portion of a housing on a basis of a mechanical operation of the gear; and a controller unit configured to control the electric motor, the operating method including: a step of sensing an optical signal of a light emitting sensor passing through a region between gear tooth of the gear and transferring an obtained sensing result to the controller unit by using a light receiving sensor; a step of counting the number of gear tooth of the gear passing through a region between the light emitting sensor and the light receiving sensor by using the controller unit on a basis of the sensing result; and a step of receiving a control command for controlling movement of the display module on a basis of the counted number of gear tooth of the gear by using an actuator.

In an embodiment, the gear includes: a pinion gear configured to perform a rotary motion on a basis of power of the actuator; and a rack gear gear-coupled to the pinion gear to change the rotary motion to a rectilinear reciprocating motion for moving the display module to the inner portion or the outer portion of the housing, and the step of counting the number of gear tooth includes a step of counting the number of gear tooth of the pinion gear.

In another aspect of the present invention, there is provided an operating method of a vehicular display apparatus including: a driving device including an actuator and a gear configured to operate based on power of the actuator; a display module configured to move to an inner portion or an outer portion of a housing on a basis of a mechanical operation of the gear; and a controller unit configured to control the actuator, the operating method including: a step of sensing an optical signal of a light emitting sensor reflected by a reflector provided on a teeth side surface of the gear and transferring an obtained sensing result to the controller unit by using the light receiving sensor; a step of counting the number of gear tooth of the gear passing through a region in front of the light emitting sensor and the light receiving sensor by using the controller unit on the basis of the sensing result; and a step of receiving a control command, controlling movement of the display module, from the controller unit by using the actuator on the basis of the counted number of gear tooth.

In an embodiment, the gear includes: a pinion gear configured to perform a rotary motion on a basis of power of the actuator; and a rack gear gear-coupled to the pinion gear to change the rotary motion to a rectilinear reciprocating motion for moving the display module to the inner portion or the outer portion of the housing, and the step of transferring the sensing result to the control unit includes a step of sensing an optical signal of a light emitting sensor reflected from a reflector provided on a teeth side surface of the pinion gear.

It is to be understood that both the foregoing general description and the following detailed description of the present invention are exemplary and explanatory and are intended to provide further explanation of the invention as claimed.

DETAILED DESCRIPTION

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

Hereinafter, embodiments of the present invention will be described in detail with reference to the accompanying drawings.

Figure 1:
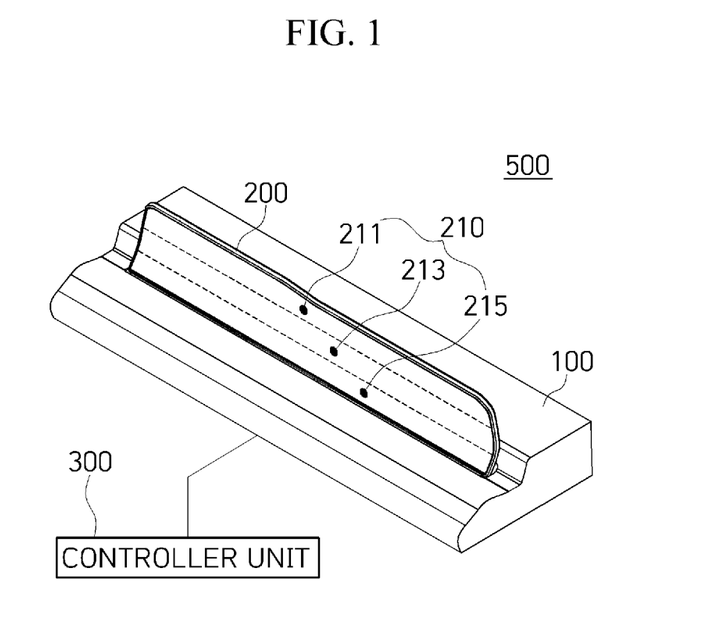
FIG. 1 is a diagram illustrating a whole external appearance of a vehicular display apparatus according to an embodiment of the present invention.
Figure 2:
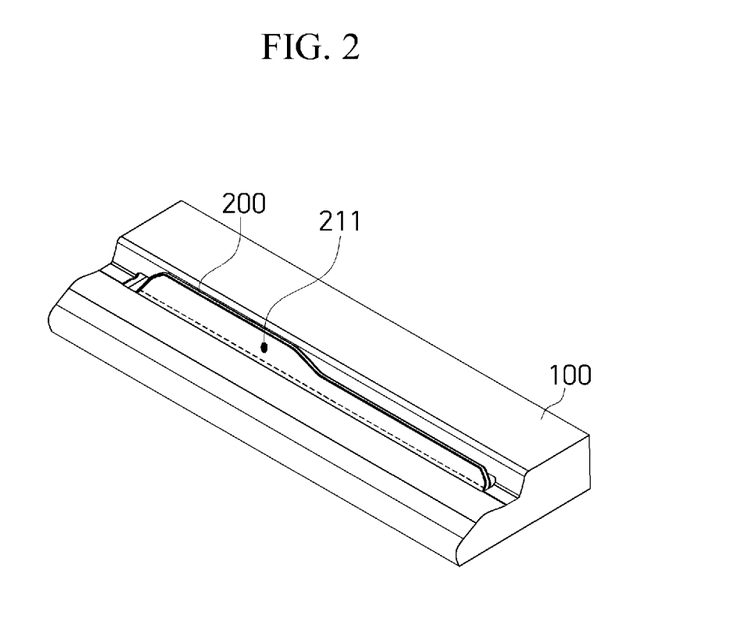
FIG. 2 is a diagram illustrating a display region of a display module exposed at the outside of a housing illustrated in FIG. 1 in a simple mode, according to an embodiment of the present invention.
Figure 3:
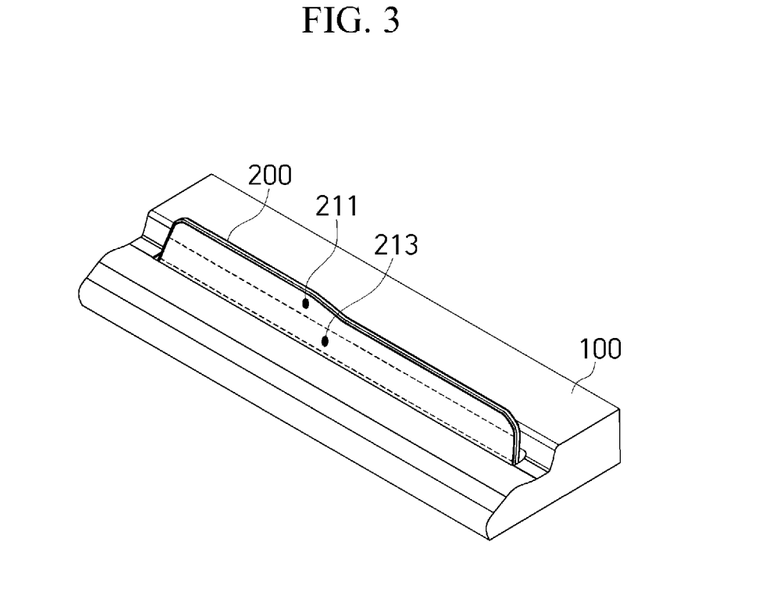
FIG. 3 is a diagram illustrating the display region of the display module exposed at the outside of the housing illustrated in FIG. 1 in a normal mode, according to an embodiment of the present invention.
Figure 4:
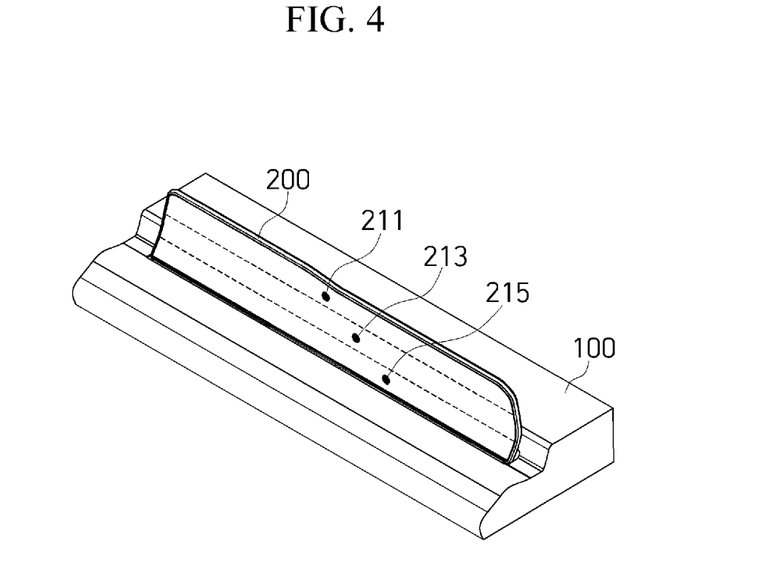
FIG. 4 is a diagram illustrating the display region of the display module exposed at the outside of the housing illustrated in FIG. 1 in a full mode, according to an embodiment of the present invention.

FIG. 1 is a diagram illustrating a whole external appearance of a vehicular display apparatus 500 according to an embodiment of the present invention. FIG. 2 is a diagram illustrating a display region of a display module exposed at the outside of a housing illustrated in FIG. 1 in a simple mode, according to an embodiment of the present invention. FIG. 3 is a diagram illustrating the display region of the display module exposed at the outside of the housing illustrated in FIG. 1 in a normal mode, according to an embodiment of the present invention. FIG. 4 is a diagram illustrating the display region of the display module exposed at the outside of the housing illustrated in FIG. 1 in a full mode, according to an embodiment of the present invention.

First, referring to FIG. 1, the vehicular display apparatus 500 may include a housing 100, a display module 200, and a controller unit 300.

The housing 100 may configure a portion of an instrument panel or a cockpit module and may include a rectangular opening portion which extends in a horizontal direction of the display module 200.

The display module 200 may be loaded into an inner portion of the housing 100 through the opening portion or may be unloaded to the outside of the housing 100 and may include a driving device for loading or unloading the display module 200 into or to the inner portion or the outside of the housing 100. The driving device may be configured to move the display module 100 into and out of the housing 100. The driving device will be described below in detail with reference to FIGS. 5 and 6.

The display module 200 may include a liquid crystal display (LCD) or an organic light emitting diode (OLED) panel, and a cross-sectional shape of thereof may be a rectilinear or curved shape. A front surface of the display module 200 may be defined as a display screen 210. The display screen 210 may be divided into a plurality of display regions. The display regions may be configured to display different pieces of information (e.g., UI information). However, the present embodiment is not limited thereto, and a display screen divided into three display regions 211, 213, and 215 is illustrated in FIG. 1.

The three display regions 211, 213, and 215 may be unloaded to the outside of the housing 100 and may be selectively exposed, based on an operation mode. The operation mode may be defined as a simple mode, a normal mode, and a full mode.

In the simple mode, as illustrated in FIG. 2, only a first display region 211, defined at an uppermost portion, of a full region of the display screen 210 may be exposed at the outside of the housing 100.

In the normal mode, as illustrated in FIG. 3, the first display region 211 and a second display region 213, defined at a center portion, of the full region of the display screen 210 may be exposed at the outside of the housing 100.

In the full mode, as illustrated in FIG. 4, the first display region 211, the second display region 213, and a third display region 215, defined at a lowermost portion, of the full region of the display screen 210 may be exposed at the outside of the housing 100.

In the simple mode of FIG. 2 where only the first display region 211 is exposed, a display area shown to a user may be smallest, and in the full mode of FIG. 4 where the first to third display regions 211, 213, and 215 are exposed, a display area shown to a user may be largest.

Therefore, in the simple mode of FIG. 2, the amount of information provided to a user may be smallest, and in the full mode of FIG. 4, the amount of information provided to the user may be largest.

The first to third display regions 211, 213, and 215 may be configured to display different (differentiated) pieces of US information. As described above, in the simple mode where only the first display region 211 is exposed, because the amount of information provided to the user is smallest, essential UI information may need to be displayed on the first display region 211. The essential UI information may include information associated with driving of a vehicle, and for example, may include information associated with a digital cluster, a digital fuel gauge, a digital speedometer, digital revolutions per minute (RPM), a vehicular battery capacity, a vehicular system breakdown, an outdoor air temperature, and/or gear shift notice.

UI information which is relatively less important may be displayed on the second and third display regions 213 and 215, and such UI information may include, for example, information associated with multimedia elements such as a radio, a music phone, and email.

For visibility of UI information displayed on each display region, only a display region defined in each operation mode may need to be exposed at the outside of the housing 100. For example, when a portion of the second display region in addition to the first display region 211 defined in the simple mode is exposed at the outside of the housing 100, the visibility of UI information displayed on the first display region 211 may be reduced by UI information displayed on a portion of the second display region. Accordingly, the movement amount (or position) of the display module 200 may be precisely controlled so that the display region defined in each operation mode is exposed at the outside of the housing 100.

The precise control of movement amount (or position) of the display module 200 may be achieved by a driving device designed in the housing 200. The driving device may be controlled by the controller unit 300 illustrated in FIG. 1.

The controller unit 300 may control the driving device on the basis of in-vehicle communication such as controller area network (CAN) communication. The controller unit 300 may be a micro controller unit (MCU) which is programmed to control the movement amount (or position) of the display module 200 by using the driving device. The MCU may be implemented so that a microprocessor, a memory, a programmable input/output (I/O) module, and a communication module are integrated into one chip.

Figure 5:
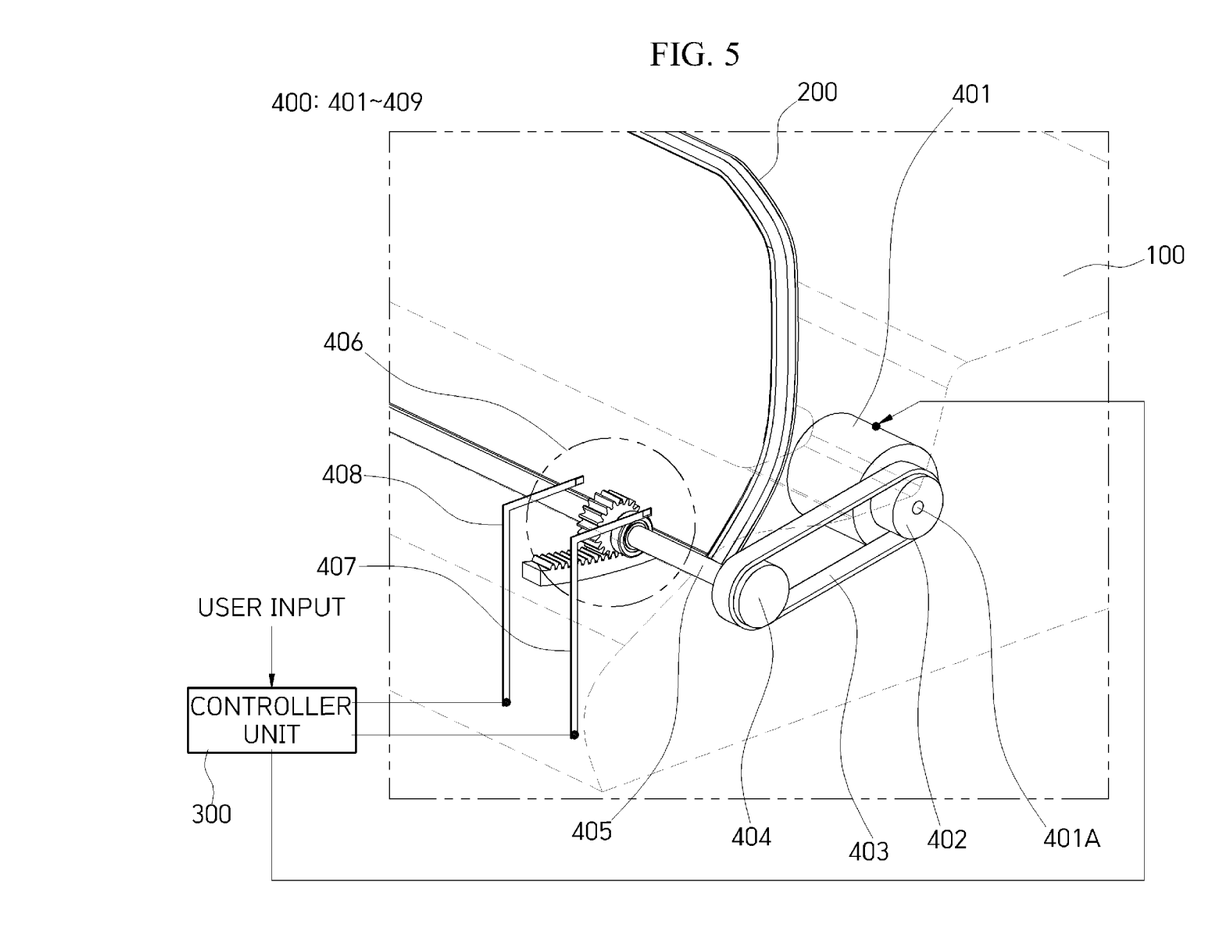
FIG. 5 is a diagram illustrating a driving device for moving the display module illustrated in FIG. 1.
Figure 6:
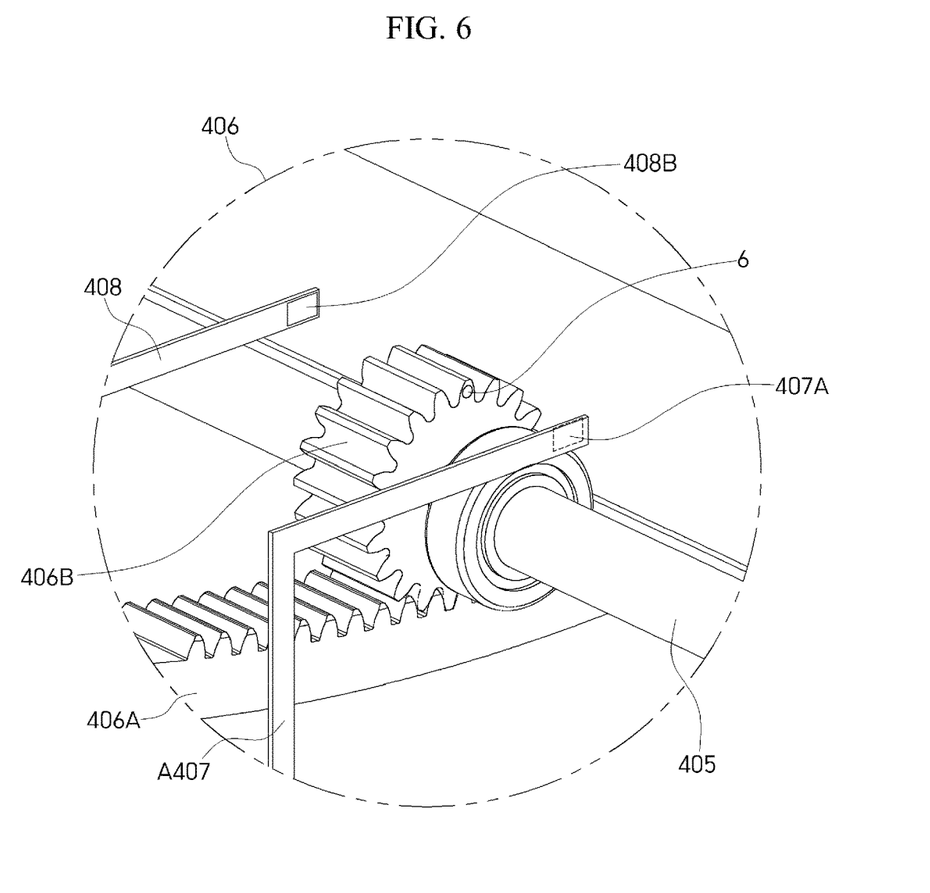
FIG. 6 is an enlarged view of a rack-pinion gear illustrated in FIG. 5.

FIG. 5 is a diagram illustrating a driving device for moving the display module illustrated in FIG. 1, and FIG. 6 is an enlarged view of a rack-pinion gear illustrated in FIG. 5.

Referring to FIGS. 5 and 6, a display module 200 may be loaded into a housing 100 or unloaded to the outside of the housing 100 on the basis of a mechanical operation of a driving device 400, and the mechanical operation of the driving device 400 may be controlled by the controller unit 300.

To this end, the driving device 400 may include an actuator 401, a main pulley 402, a timing belt 403, a sub-pulley 404, a rotary shaft 405, and a rack-pinion gear 406, and moreover, may further include a reflector 70, two supporters 407 and 408, and sensor units 407A and 408B. The sensor units 407A and 408B may include a light emitting sensor 407A and a light receiving sensor 408B.

The actuator 401 may generate power for loading the display module 200 into the housing 100 or unloading the display module 200 to the outside and may stop the generating of the power so that a display area other than the display area defined for each operation mode is not exposed at the outside of the housing 100, based on a stop command of the controller unit 300.

In an embodiment, the power may be rotary power, and in this case, the actuator 401 may be implemented with an electric motor. Hereinafter, the actuator 401 may be assumed as an electric motor and may be referred to by like reference numeral.

The main pulley 402 may be coupled to the rotary shaft 401A of the electric motor 401 and may rotate clockwise or counterclockwise, based on the rotary power of the electric motor 401.

The timing belt 403 may transfer the rotary power of the main pulley 402, which rotates clockwise or counterclockwise, to the sub-pulley 404.

The sub-pulley 404 may rotate clockwise or counterclockwise, based on rotary power transferred through the timing belt 403. The rotary shaft 405 may be coupled to the sub-pulley 404, and the rotary shaft 405 may rotate clockwise or counterclockwise, based on a rotation of the sub-pulley 404.

The rack-pinion gear 406 may be coupled to the rotary shaft 405, and the rack-pinion gear 406 may transform a rotary motion of the rotary shaft 405 to a rectilinear reciprocating motion. Based on the rectilinear reciprocating motion, the display module 200 may be loaded into the housing 100, or may be unloaded to the outside of the housing 100.

In detail, as illustrated in FIG. 6, the rack-pinion gear 406 may include a rack gear 406A and a pinion gear 406B which is gear-coupled to the rack gear 406A.

The rack gear 406A may be implemented in a "1"-shape, one end portion thereof may be connected to a lower end of the display module 200, and the pinion gear 406B may be coupled to the rotary shaft 405.

The pinion gear 406B may perform a rotary motion on the basis of a rotation of the rotary shaft 405, and the rack gear 406A gear-coupled to the pinion gear 406B may transform a rotary motion to a rectilinear reciprocating motion, and the display module 200 coupled to the one end portion of rack gear 406A may also perform a rectilinear reciprocating motion on the basis of the rectilinear reciprocating motion of the rack gear 406A. Based on the rectilinear reciprocating motion, the display module 200 may be loaded into the housing 100, or may be unloaded to the outside of the housing 100.

In a case where the display module 200 is implemented in a bent shape, the rack gear 406A may be implemented in a slightly bent shape so that the bent display module 200 is smoothly loaded or unloaded through an opening portion of the housing 100.

Furthermore, in an embodiment of the present invention, in order to precisely control the movement amount (or position) of the display module 200, the number of gear teeth of the pinion gear 406B passing through a fixed point may be counted, and the movement amount (or position) of the display module 200 may be calculated based on the counted number of gear teeth of the pinion gear 406b.

In an embodiment of the present invention, the light emitting sensor 407A and the light receiving sensor 408B may be used for counting the number of gear teeth of the pinion gear 406B. The light emitting sensor 407A and the light receiving sensor 408B may be disposed to face each other with the pinion gear 406b therebetween.

In order to implement such an arrangement structure, the two supporters 407 and 408 may be disposed with the pinion gear 406b therebetween, and the light emitting sensor 407A and the light receiving sensor 408B may be installed to face each other at end portions of the supporters 407 and 408.

Each of the supporters 407 and 408 may be a printed circuit board (PCB) with the light emitting sensor 407A and the light receiving sensor 408B mounted thereon, and in this case, as illustrated in FIGS. 5 and 6, may be a PCB which is manufactured in an L-shape.

The light emitting sensor 407A may generate an optical signal such as an infrared signal and may transfer the optical signal to the light receiving sensor 408B. In this case, based on the gear teeth of the pinion gear 406b passing through a region between the light emitting sensor 407A and the light receiving sensor 408B, the light receiving sensor 408A may selectively receive the optical signal transferred from the light emitting sensor 407A.

That is, because the light receiving sensor 408B receives only an optical signal passing through a region between adjacent teeth of the pinion gear 406b, the number of gear teeth of the pinion gear 406b may be counted by counting the number of optical signals received by the light receiving sensor 408B.

The controller unit 300 may receive the optical signal from the light receiving sensor 408B through the supporter 408 which acts as a PCB, and the number of rectangular pulses corresponding to the received optical signal may be counted as the number of gear teeth of the pinion gear 406b passing through a region between the light emitting sensor 407A and the light receiving sensor 408B.

Subsequently, the controller unit 300 may precisely control the movement amount (or position) of the display module 200 on the basis of the counted number of gear teeth of the pinion gear 406B, with reference to a lookup table.

The lookup table may be a table where the number of gear teeth of the pinion gear 406b mapped to the movement amount (or position) of the display module 200 for each operation mode is defined and may be stored in a memory of the controller unit 300.

In an embodiment, when the current counted number of gear teeth of the pinion gear 406b matches the predetermined number of gear teeth of the pinion gear 406b recorded in the lookup table, the controller unit 300 may transfer an operation stop command to the electric motor 401 to stop an operation of the electric motor 401.

Although not shown in FIG. 5, the controller unit 300 may include a motor controller which directly controls an operation of the electric motor 401.

Furthermore, in FIGS. 5 and 6, the light emitting sensor 407A and the light receiving sensor 408B respectively installed in the two supporters 407 and 408 with the pinion gear 406B therebetween are illustrated, but the present invention is not limited thereto. In other embodiments, the light emitting sensor 407A and the light receiving sensor 408B may be installed in one supporter, and the number of gear teeth of the pinion gear 406B rotating may be counted.

In a case where the light emitting sensor 407A and the light receiving sensor 408B are installed in one supporter, as illustrated in FIG. 6, the reflector 6 is provided on a teeth side surface of the pinion gear 406B, the light receiving sensor 40B may receive an optical signal reflected by the reflector 6.

When a material of the reflector 6 is a material for reflecting the optical signal transferred from the light emitting sensor 407A, the kind thereof is not limited. The reflector 6 may be formed by coating a material, which may be attached on the teeth side surface of the pinion gear 406B or may reflect an optical signal, on the teeth side surface of the pinion gear 406B.

The reflector 6 may not be provided on side surfaces of all gear teeth of the pinion gear 406B and may be provided on side surfaces of some gear teeth of the pinion gear 406B with a certain interval therebetween.

Figure 7:
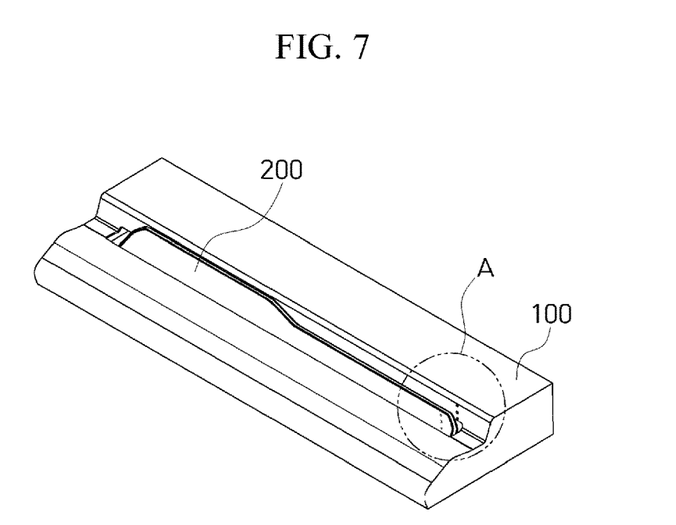
FIGS. 7 and 8 are diagrams for describing an installations structure of a light emitting sensor and a light receiving sensor for precisely controlling the movement amount (or position) of a display module according to another embodiment of the present invention.
Figure 8:
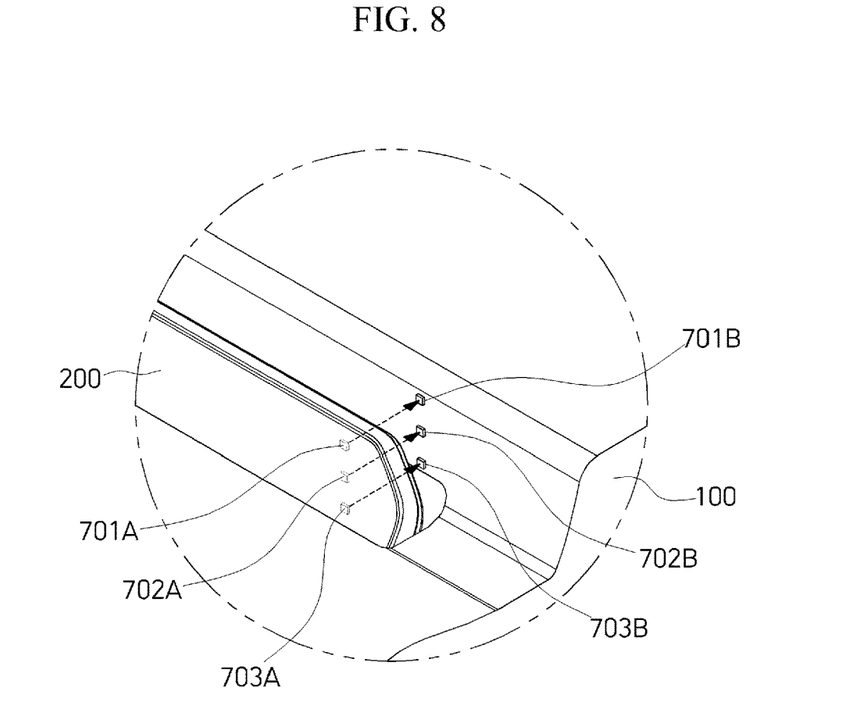

FIGS. 7 and 8 are diagrams for describing an installations structure of a light emitting sensor and a light receiving sensor for precisely controlling the movement amount (or position) of a display module according to another embodiment of the present invention.

Referring to FIGS. 7 and 8, according to another embodiment of the present invention, a plurality of light emitting sensors 701A, 702A, and 703A may be arranged on a rear surface of a display module 200 in a vertical direction. Accordingly, the plurality of light emitting sensors 701A, 702A, and 703A may move in a movement direction of the display module 200.

A plurality of (for example, three) light receiving sensors 701B, 702B, and 703B may be arranged in a vertical direction on a front surface of a housing 100 facing the rear surface of the display module 200 to face the plurality of light emitting sensors 701A, 702A, and 703A. In this case, the plurality of (for example, three) light receiving sensors 701B, 702B, and 703B may be fixed without moving, unlike the plurality of light emitting sensors 701A, 702A, and 703A.

On the other hand, the plurality of (for example, three) light receiving sensors 701B, 702B, and 703B may be disposed on the rear surface of the display module 200, and the plurality of light emitting sensors 701A, 702A, and 703A may be disposed on the front surface of the housing 100.

In FIGS. 7 and 8, an embodiment is illustrated where three light emitting sensors 701A, 702A, and 703A are disposed on the rear surface of the display module 200 and the three light receiving sensors 701B, 702B, and 703B are disposed on the front surface of the housing 100.

Figure 9:
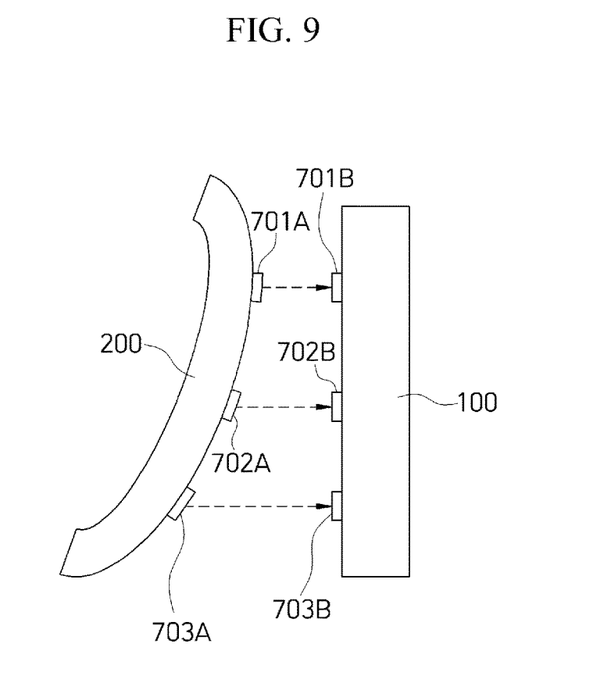
FIGS. 9 and 10 are diagrams for describing an operation principle of each of a light emitting sensor and a light receiving sensor for precisely controlling the movement amount (or position) of a display module according to another embodiment of the present invention.
Figure 10:
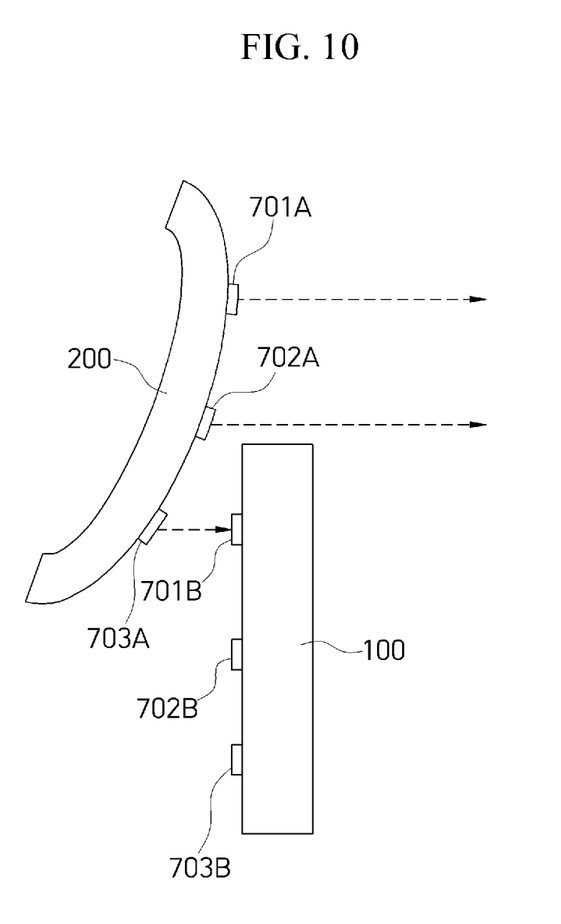

FIGS. 9 and 10 are diagrams for describing an operation principle of each of a light emitting sensor and a light receiving sensor for precisely controlling the movement amount (or position) of a display module according to another embodiment of the present invention.

FIG. 9 illustrates positions of light emitting sensors and light receiving sensors in the simple mode, and FIG. 10 illustrates positions of light emitting sensors and light receiving sensors in the full mode.

As illustrated in FIG. 9, in the simple mode where only a first display region (211 of FIG. 2) of a display module 200 is exposed, a plurality of light emitting sensors 701A, 702A, and 703A and a plurality of light receiving sensors 701B, 702B, and 703B may be horizontally arranged in parallel in a one-to-one relationship, and all of the light receiving sensors 701B, 702B, and 703B may receive optical signals from the light emitting sensors 701A, 702A, and 703A.

When an optical signal sensing result is received from all of the light receiving sensors 701B, 702B, and 703B, the controller unit 300 may transfer an operation stop command to an electric motor 401 to stop an operation of the electric motor 401.

As illustrated in FIG. 10, in the full mode where all of display regions (211, 213, and 215 of FIGS. 1 to 4) of the display module 200 are exposed, the light emitting sensor 703A disposed at a lowermost portion of a rear surface of the display module 200 among the light emitting sensors 701A, 702A, and 703A and the light receiving sensor 701B disposed at an uppermost portion among the light receiving sensors 701B, 702B, and 703B may be horizontally arranged in parallel, and the light receiving sensor 701B may receive only an optical signal transferred from the light emitting sensor 703A.

When the controller unit 300 receives an optical signal sensing result from the light emitting sensor 701B, the controller unit 300 may transfer an operation stop command to the electric motor 401 to stop an operation of the electric motor 401.

Although not shown, in the normal mode, two light emitting sensors 702A and 703A and two light receiving sensors 701B and 702B may be horizontally arranged in parallel, and the light receiving sensors 701B and 702B may receive optical signals transferred from the light emitting sensors 702A and 703A.

When the controller unit 300 receives an optical signal sensing result from each of the light receiving sensors 701B and 702B, the controller unit 300 may transfer the operation stop command to the electric motor 401 to stop an operation of the electric motor 401.

As described above, the vehicular display apparatus according to an embodiment of the present invention may quantitatively control the movement amount (or position) of the display module by using a light emitting sensor and a light receiving sensor, and thus, may precisely expose a display region, defined for each operation mode, at the outside of the housing 100 without an error.

Figure 11:
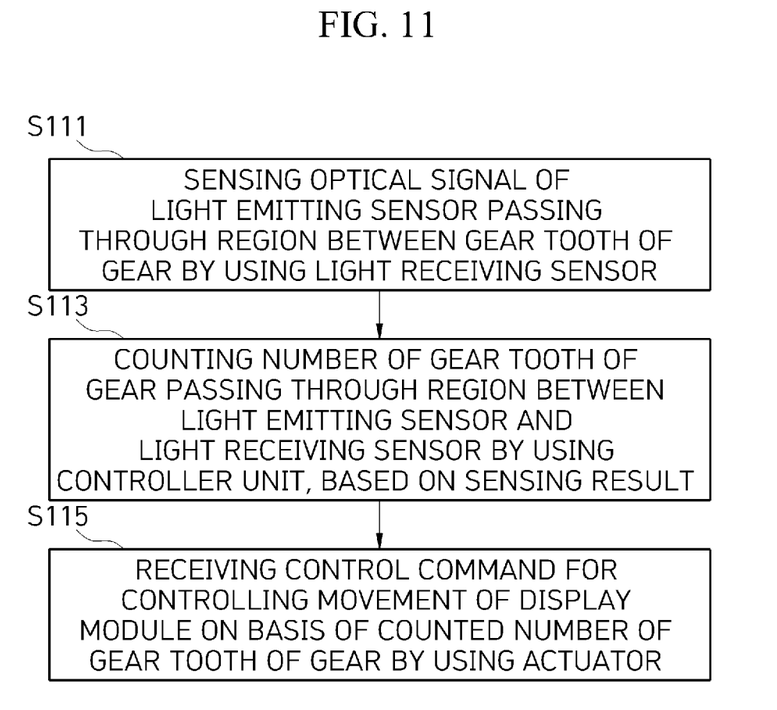
FIG. 11 is a flowchart illustrating an operating method of a vehicular display apparatus according to an embodiment of the present invention.

FIG. 11 is a flowchart illustrating an operating method of a vehicular display apparatus according to an embodiment of the present invention.

Referring to FIG. 11, the operating method of the vehicular display apparatus according to an embodiment of the present invention may be an operating method of a vehicular display apparatus which includes a driving device 400 including an electric motor 401 and a gear 406 operating based on power of the electric motor 401, a display module 200 which moves to an inner portion or the outside of the housing 100 on the basis of a mechanical operation of the gear 406, and a controller unit 300 controlling the electric motor 401.

In the operating method according to an embodiment of the present invention, first, in step S111, a process of sensing an optical signal of the light emitting sensor 407A passing through a region between gear teeth of the gear 406 and transferring an obtained sensing result to the controller unit 300 by using the light receiving sensor 408B may be performed.

Subsequently, in step S113, a process of counting the number of gear teeth of the gear 406 passing through a region between the light emitting sensor 407A and the light receiving sensor 408B by using the controller unit 300 on the basis of the sensing result may be performed.

Subsequently, in step S115, a process of receiving a control command for controlling movement of the display module 200 on the basis of the counted number of gear teeth of the gear 406 by using the actuator 401 may be performed.

In an embodiment, when the gear 406 includes the pinion gear 406B which performs a rotary motion on the basis of power of the actuator 401 and the rack gear 406A which is gear-coupled to the pinion gear 406B and changes the rotary motion to a rectilinear reciprocating motion for moving the display module 200 to an inner portion or the outside of the housing 100, a process of counting the number of gear teeth of the gear 406 may be a process of counting the number of gear teeth of the pinion gear 406B.

Figure 12:
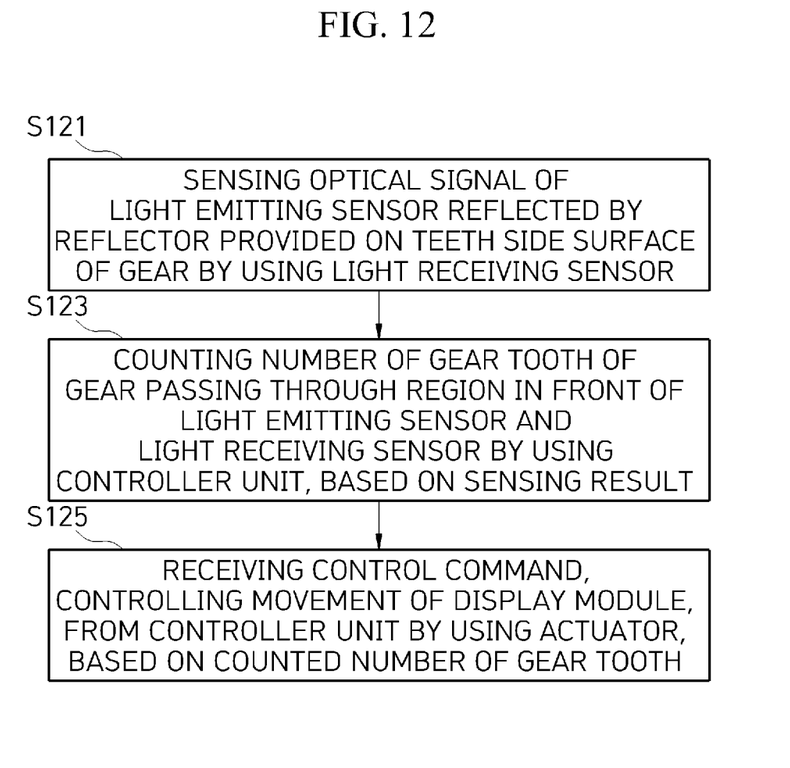
FIG. 12 is a flowchart illustrating an operating method of a vehicular display apparatus according to another embodiment of the present invention.

FIG. 12 is a flowchart illustrating an operating method of a vehicular display apparatus according to another embodiment of the present invention.

Referring to FIG. 12, in step S121, a process of sensing an optical signal of a light emitting sensor reflected by the reflector 6 provided on the teeth side surface of the gear 406 and transferring an obtained sensing result to the controller unit 300 by using the light receiving sensor 408B may be performed. In this case, although not shown, the light emitting sensor 407A and the light receiving sensor 408B may be installed in one supporter 407.

Subsequently, in step S123, a process of counting the number of gear teeth of the gear 406 passing through a region in front of the light emitting sensor 407A and the light receiving sensor 408B by using the controller unit 300 on the basis of the sensing result may be performed.

Subsequently, in step S125, a process of receiving a control command, controlling movement of the display module 200, from the controller unit 300 by using the actuator 401 on the basis of the counted number of gear teeth may be performed.

In an embodiment, when the gear 406 includes the pinion gear 406B which performs a rotary motion on the basis of power of the actuator 401 and the rack gear 406A which is gear-coupled to the pinion gear 406B and transforms the rotary motion to a rectilinear reciprocating motion for moving the display module 200 to an inner portion or the outside of the housing 100, a process of transferring the sensing result based on step S121 to the controller unit 300 may include a process of sensing an optical signal of the light emitting sensor 407A reflected by a reflector (6 of FIG. 6) provided on the teeth side surface of the pinion gear 406B.

According to the embodiments of the present invention, the movement amount (or position) of a display module may be quantitatively controlled by using a light emitting sensor and a light receiving sensor, and thus, a display region defined for each operation mode may be exposed at the outside of a housing without an error.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A vehicular display apparatus comprising:
a housing;
a display module;
a driving device configured to perform a mechanical operation to move the display module in and out of the housing; and
a controller unit configured to control the mechanical operation of the driving device,
wherein the driving device comprises:
a gear configured to move the display module in and out of the housing; and
a light emitting sensor and a light receiving sensor facing each other with the gear therebetween, the light receiving sensor configured to sense an optical signal from the light emitting sensor passing through a first region between gear teeth of the gear, and
wherein the controller unit is configured to:
count, based on the sensed optical signal, a number of the gear teeth of the gear passing through a second region between the light emitting sensor and the light receiving sensor; and
control, based on the counted number of the gear teeth, the mechanical operation of the driving device to cause movement of the display module.

2. The vehicular display apparatus of claim 1, wherein:
the gear comprises:
a first gear configured to perform a rotary motion; and
a second gear gear-coupled to the first gear and configured to transform the rotary motion to a rectilinear reciprocating motion, and
the light receiving sensor is configured to sense the optical signal from the light emitting sensor passing through the first region between gear teeth of the first gear.

3. The vehicular display apparatus of claim 2, wherein:
the display module is coupled to an end portion of the second gear, and
the driving device is configured to move the display module into and out of the housing based on the rectilinear reciprocating motion of the second gear.

4. The vehicular display apparatus of claim 1, wherein, when the counted number of the gear teeth matches a predetermined number of the gear teeth, the controller unit is configured to transfers, to the driving device, a stop command for stopping the movement of the display module.

5. The vehicular display apparatus of claim 4, wherein:
the display module has a screen divided into a plurality of display regions and is configured to display, via the plurality of display regions, a plurality of pieces of information, and the predetermined number of gear teeth corresponds to a movement amount of the display module exposing at least one of the plurality of display regions outside the housing.

6. The vehicular display apparatus of claim 1, wherein:
the driving device comprises:
an electric motor having a rotary shaft and configured to generate rotary power;
a main pulley coupled to the rotary shaft of the electric motor and configured to rotate based on the rotary power transferred from the electric motor; and
a sub-pulley having a rotary shaft, coupled to the main pulley via a timing belt and configured to receive the rotary power from the main pulley through the timing belt, and
the gear comprises:
a pinion gear coupled to the rotary shaft of the sub-pulley and configured to perform a rotary motion based on the rotary power transferred from the sub-pulley; and
a rack gear gear-coupled to the pinion gear and configured to transform the rotary motion of the pinion gear to a rectilinear reciprocating motion.

7. The vehicular display apparatus of claim 6, wherein the light receiving sensor is configured to sense the optical signal from the light emitting sensor passing through the first region between gear teeth of the pinion gear.

8. The vehicular display apparatus of claim 6, wherein:
the display module is coupled to an end portion of the rack gear, and
the driving device is configured to move the display module into and out of the housing based on the rectilinear reciprocating motion of the rack gear.

9. A vehicular display apparatus comprising:
a housing;
a display module;
a driving device configured to perform a mechanical operation to move the display module into and out of the housing; and
a controller unit configured to control the mechanical operation of the driving device,
wherein the driving device comprises:
a gear including a plurality of gear teeth and configured to move the display module into and out of the housing, wherein at least some of the gear teeth have a teeth side surface and a reflector disposed at the teeth side surface;
a light emitting sensor configured to transfer an optical signal to the reflector; and
a light receiving sensor configured to sense the optical signal reflected by the reflector, and
the controller unit is configured to:
count a number of the gear teeth of the gear passing through a region between the light emitting sensor and the light receiving sensor based on the sensed optical signal; and
control, based on the counted number of the gear teeth, movement of the display module.

10. The vehicular display apparatus of claim 9, wherein:
the gear comprises:
a first gear configured to perform a rotary motion; and
a second gear gear-coupled to the first gear and configured to transform the rotary motion to a rectilinear reciprocating motion, and
the light receiving sensor is configured to sense the optical signal reflected by the reflector disposed on a teeth side surface of the first gear.

11. The vehicular display apparatus of claim 9, wherein, when the counted number of the gear teeth matches a predetermined number of the gear teeth, the controller unit is configured to transfer, to the driving device, a stop command for stopping the movement of the display module.

12. The vehicular display apparatus of claim 9, wherein:
the driving device comprises:
an electric motor having a rotary shaft and configured to generate rotary power;
a main pulley coupled to the rotary shaft of the electric motor and configured to rotate based on the rotary power from the electric motor; and
a sub-pulley having a rotary shaft, coupled to the main pulley via a timing belt, and configured to receive the rotary power from the main pulley through the timing belt, and
the gear comprises:
a pinion gear coupled to the rotary shaft of the sub-pulley and configured to perform a rotary motion; and
a rack gear gear-coupled to the pinion gear and configured to transform the rotary motion from the pinion gear to a rectilinear reciprocating motion.

13. The vehicular display apparatus of claim 12, wherein the light receiving sensor is configured to sense the optical signal reflected by the reflector disposed on a teeth side surface of the pinion gear.

14. A vehicular display apparatus comprising:
a housing;
a display module;
a driving device configured to perform a mechanical operation to move the display module into and out of the housing;
a plurality of light emitting sensors arranged on a rear surface of the display module and configured to move in a movement direction of the display module;
a plurality of light receiving sensors arranged on a front surface of the housing and facing the plurality of light emitting sensors, each light receiving sensor configured to sense an optical signal from one of the light emitting sensors; and
a controller unit configured to:
receive, from at least one light receiving sensor, the sensed optical signal; and
control, based on the received optical signal, the driving device to stop the movement of the display module.

15. The vehicular display apparatus of claim 14, wherein:
the display module has a screen divided into a plurality of display regions and configured to display a plurality of pieces of information on the plurality of display regions,
the plurality of light receiving sensors are configured to sense the optical signals from the plurality of light emitting sensors, and
the controller unit is configured to determine that one of the plurality of display regions is exposed outside the housing, and transfers, to the driving device, a stop command for stopping the movement of the display module.

16. The vehicular display apparatus of claim 14, wherein:
the display module has a screen divided into a plurality of display regions and configured to display a plurality of pieces of information on the plurality of display regions, and
when at least one of the plurality of light receiving sensors senses the optical signal from the plurality of light emitting sensors, the controller unit is configured to determine that all of the plurality of display regions are exposed outside the housing, and transfer, to the driving device, a stop command for stopping the movement of the display module.

\* \* \* \* \*